United States Patent
Cline et al.

(10) Patent No.: US 7,893,479 B2
(45) Date of Patent: *Feb. 22, 2011

(54) DEEP TRENCH IN A SEMICONDUCTOR STRUCTURE

(75) Inventors: June Cline, Essex Junction, VT (US); Dinh Dang, Essex Junction, VT (US); Mark Lagerquist, Essex Junction, VT (US); Jeffrey C. Maling, Essex Junction, VT (US); Lisa Y. Ninomiya, Essex Junction, VT (US); Bruce W. Porth, Essex Junction, VT (US); Steven M. Shank, Essex Junction, VT (US); Jessica A. Trapasso, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/538,193

(22) Filed: Aug. 10, 2009

(65) Prior Publication Data

US 2009/0294926 A1    Dec. 3, 2009

Related U.S. Application Data

(60) Continuation of application No. 11/458,828, filed on Jul. 20, 2006, now Pat. No. 7,573,085, and a division of application No. 10/711,953, filed on Oct. 15, 2004, now Pat. No. 7,101,806.

(51) Int. Cl.
*H01L 29/108* (2006.01)

(52) U.S. Cl. .......................... 257/296; 257/E21.035; 257/E21.023; 438/736

(58) Field of Classification Search ................. 438/238, 438/296, 330, 386, 424, 736; 257/296, 330, 257/E21.035, E21.023
See application file for complete search history.

(56) References Cited

U.S. PATENT DOCUMENTS

| 5,472,827 | A  | 12/1995 | Ogawa et al. |
| 5,807,789 | A  | 9/1998  | Chen et al.  |
| 6,020,269 | A  | 2/2000  | Wang et al.  |
| 6,127,278 | A  | 10/2000 | Wang et al.  |
| 6,180,533 | B1 | 1/2001  | Jain et al.  |

(Continued)

OTHER PUBLICATIONS

Streetman, Ben G.; "Solid State Electronic Devices"; 1990, Prentice Hall, Third Edition, p. 332.

(Continued)

*Primary Examiner*—Eugene Lee
*Assistant Examiner*—Tucker Wright
(74) *Attorney, Agent, or Firm*—Schmeiser, Olsen & Watts; David Cain

(57) ABSTRACT

A semiconductor structure. A hard mask layer is on a top substrate surface of a semiconductor substrate. The hard mask layer includes a hard mask layer opening through which a portion of the top substrate surface is exposed to a surrounding ambient. The hard mask layer includes a pad oxide layer on the top substrate surface, a nitride layer on the pad oxide layer, a BSG (borosilicate glass) layer on top of the nitride layer, and an ARC (anti-reflective coating) layer on top of the BSG layer. A BSG side wall surface of the BSG layer is exposed to the surrounding ambient through the hard mask layer opening.

7 Claims, 7 Drawing Sheets

U.S. PATENT DOCUMENTS

| | | |
|---|---|---|
| 6,190,955 B1 | 2/2001 | Ilg et al. |
| 6,235,214 B1 | 5/2001 | Deshmukh et al. |
| 6,318,384 B1 | 11/2001 | Khan et al. |
| 6,380,095 B1 | 4/2002 | Liu et al. |
| 6,506,663 B1 | 1/2003 | Barlocchi et al. |
| 6,653,734 B2 | 11/2003 | Flanner et al. |
| 6,676,800 B1 | 1/2004 | Festa et al. |
| 6,727,158 B2 | 4/2004 | Sundt et al. |
| 6,921,705 B2 | 7/2005 | Choi et al. |
| 2003/0153158 A1 | 8/2003 | Ho et al. |

OTHER PUBLICATIONS

Wolf et al.; "Silicon Processing for the VLSI Era"; 1986, Lattice Press, vol. 1; pp. 514-515.

Handbook of Thin Film Technology, Edited by Leon I. Maissel and Reinhard Glang, Copyright 1970; p. 7-44.

Notice of Allowance (Mail Date Apr. 7, 2009) for U.S. Appl. No. 11/458,828, filed Jul. 20, 2006.

FIG. 2

| Row | Column 1 | Column 2 | Column 3 | Column 4 | Column 5 |
|---|---|---|---|---|---|
| 1 | Etching Parameters [Unit] | Etching through ARC layer | Etching through BSG layer | Etching through Silicon Nitride layer and pad oxide layer | De-polymerization |
| 2 | RF Power [W] | 500 | 1,400 | 1,000 | 500 |
| 3 | Time [sec] | 80 | 330 | 35 | 20 |
| 4 | Pressure [mT] | 160 | 45 | 50 | 200 |
| 5 | CO [sccm] | 0 | 50 | 40 | 0 |
| 6 | Ar [sccm] | 500 | 200 | 0 | 100 |
| 7 | $C_4F_8$ [sccm] | 0 | 10 | 0 | 0 |
| 8 | $O_2$ [sccm] | 10 | 5 | 6 | 30 |
| 9 | $CH_2F_2$ [sccm] | 20 | 0 | 20 | 0 |

DEEP TRENCH IN A SEMICONDUCTOR STRUCTURE

This application is a continuation application claiming priority to Ser. No. 11/458,828, filed Jul. 20, 2006; which is a divisional application of U.S. Pat. No. 7,101,806, issued Sep. 5, 2006.

BACKGROUND OF THE INVENTION

1. Technical Field

The present invention relates to deep trenches, and more particularly, to the formation of a deep trench in a semiconductor substrate.

2. Related Art

Deep and narrow trenches have been used for several purposes in semiconductor devices, one of which is to serve as storage-capacitor structures. Typically, a deep trench is created in a semiconductor substrate by first forming a hard mask layer (which itself can comprise multiple layers) on top of the semiconductor substrate. Then, an opening is created in the hard mask layer. Next, through the opening, etching of the deep trench in the semiconductor substrate is performed. During the etching of the deep trench, energetic, heavy ions are used to bombard the bottom of the deep trench so that chemical etching reactions can continue downward. However, this ion bombardment can also break through the polymer layer on the side walls of the deep trench and cause damages to the side walls of the deep trench. These damages to the side walls of the deep trench may detrimentally affect the quality of the resulting device.

Therefore, there is a need for a novel method for forming a deep trench that eliminates (or at least reduces) the damage to the side walls of the deep trench which occurs during the etching of the deep trench.

SUMMARY OF THE INVENTION

The present invention provides a method for forming semiconductor structures, the method comprising the steps of (a) forming a first plurality of deep trenches, wherein forming each trench of the first plurality of deep trenches includes the steps of (i) providing a semiconductor substrate, (ii) forming a hard mask layer on top of the semiconductor substrate, (iii) etching a hard mask opening in the hard mask layer so as to expose the semiconductor substrate to the atmosphere through the hard mask layer opening, wherein the step of etching the hard mask opening comprises the step of etching a bottom portion of the hard mask opening according to a first set of etching parameters, (iv) etching a deep trench in the substrate via the hard mask opening; and (b) if a first yield of the first plurality of deep trenches is not within a pre-specified range of a target yield, forming a second plurality of deep trenches, wherein each trench of the second plurality of deep trenches is formed by using steps (a)(i) through (a)(iv), except that the step of etching the bottom portion of the hard mask opening is performed according to a second set of etching parameters, wherein the second set of etching parameters are adjusted from the first set of etching parameters such that, for each trench of the second plurality of deep trenches, a side wall of the bottom portion of the hard mask opening is more vertical than that corresponding to a trench of the first plurality of deep trenches.

The present invention also provides a method for forming a semiconductor structure, the method comprising the steps of (a) providing a semiconductor substrate; (b) forming a hard mask layer on top of the semiconductor substrate; (c) etching a hard mask opening in the hard mask layer so as to expose the semiconductor substrate to the atmosphere through the hard mask layer opening, wherein the step of etching the hard mask opening comprises the step of etching a bottom portion of the hard mask opening such that a side wall of the bottom portion of the hard mask opening is substantially vertical; and (d) etching a deep trench in the substrate via the hard mask opening.

The present invention also provides a semiconductor structure, comprising (a) a semiconductor substrate; (b) a hard mask layer on top of the semiconductor substrate; and (c) a hard mask layer opening in the hard mask layer, wherein the semiconductor substrate is exposed to the atmosphere through the hard mask layer opening, wherein the hard mask layer opening comprises top and bottom portions, wherein the bottom portion is beneath the top portion, and wherein a side wall of the bottom portion of the hard mask layer opening is substantially vertical.

The present invention provides a novel method for forming a deep trench that eliminates (or at least reduces) the damage to the side walls of the deep trench which occurs during the etching of the deep trench.

BRIEF DESCRIPTION OF THE DRAWINGS

FIG. 2 lists parameters and their values for creating a hard mask layer opening in the semiconductor structure of FIG. 1, in accordance with embodiments of the present invention.

DETAILED DESCRIPTION OF THE INVENTION

Figure 1A:
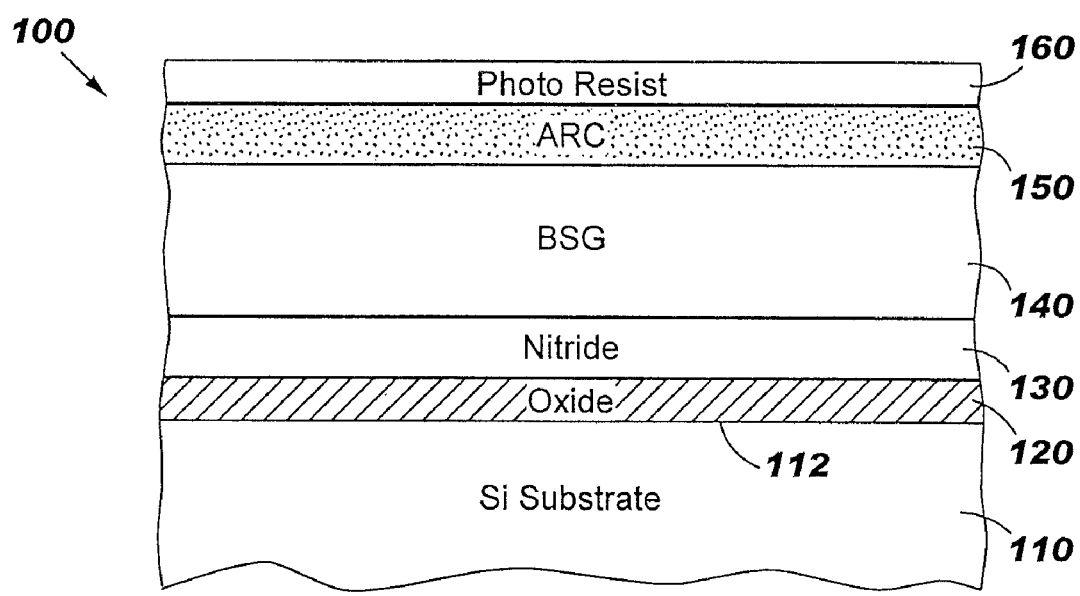
FIGS. 1A-1F show cross sectional views of a semiconductor structure used to illustrate a method for forming a deep trench in the semiconductor structure, in accordance with embodiments of the present invention.

FIGS. 1A-1F show a semiconductor structure 100 used to illustrate a method for forming a deep trench 180 (FIG. 1F) in the structure 100, in accordance with embodiments of the present invention. More specifically, the method starts out with the step of providing the structure 100 of FIG. 1A comprising, illustratively, (a) a semiconductor (e.g., silicon, germanium, etc.) substrate 110, (b) a hard mask layer 120,130, 140,150 (i.e., comprising layers 120, 130, 140, and 150) formed on top of the semiconductor substrate 110, and (c) a photo resist layer 160 formed on top of the hard mask layer 120,130,140,150.

In one embodiment, the hard mask layer 120,130,140,150 comprises, a pad oxide layer 120, a nitride layer 130, a BSG (borosilicate glass) layer 140, and an ARC (anti-reflective coating) layer 150 formed on top of one another in that order. In general, any hard mask layer that remains relatively intact during the ensuing etching of the deep trench 180 (FIG. 1E) in the substrate 110 can be used.

Here, more specifically, if the substrate 110 comprises silicon, then the pad oxide layer 120 can be formed by, illustratively, thermally oxidizing the top surface 112 of the substrate 110. Then, the nitride layer 130 can be formed by, illustratively, CVD (chemical vapor deposition) of silicon nitride on top of the pad oxide layer 120. Then, the BSG layer 140 can be formed on top of the nitride layer 130, and then the ARC layer 150 can be formed on top of the BSG layer 140 by using any conventional methods. Finally, the photo resist layer 160 can be formed on top of the hard mask layer 120, 130,140,150.

Figure 1B:
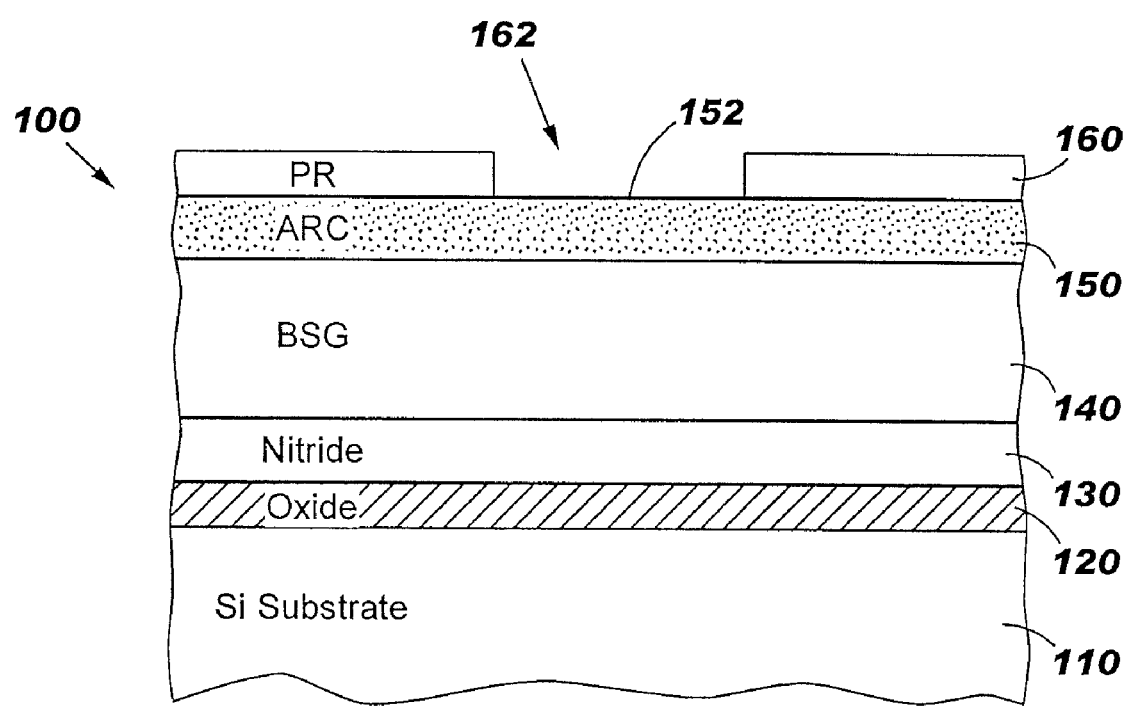
Figure 1C:
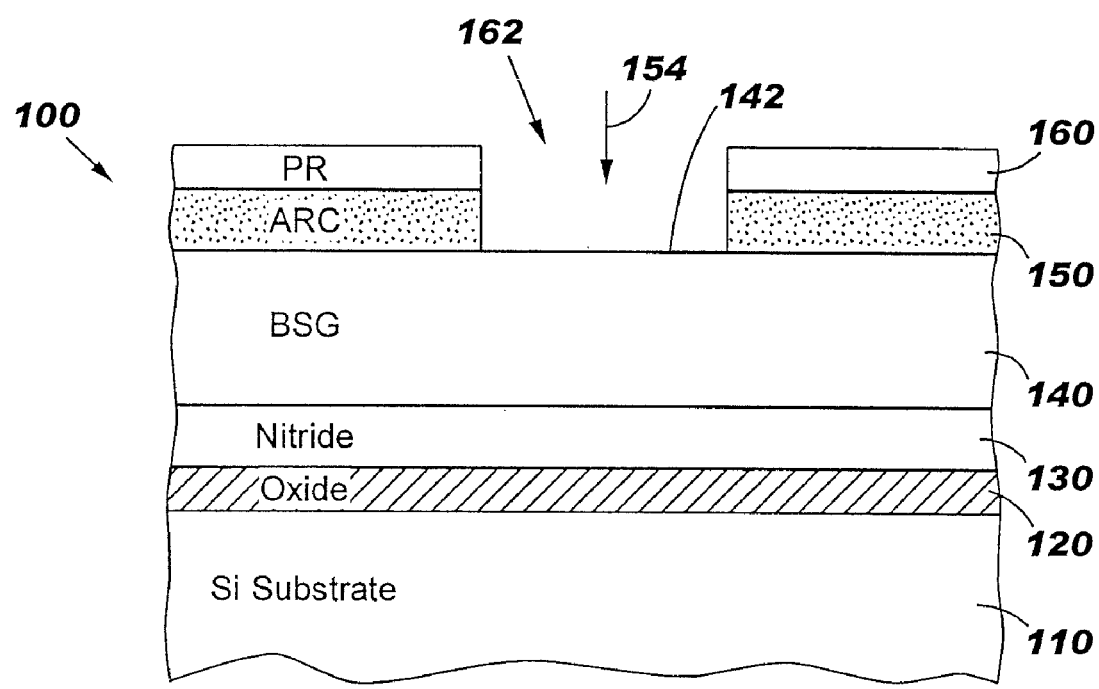
Figure 1D:
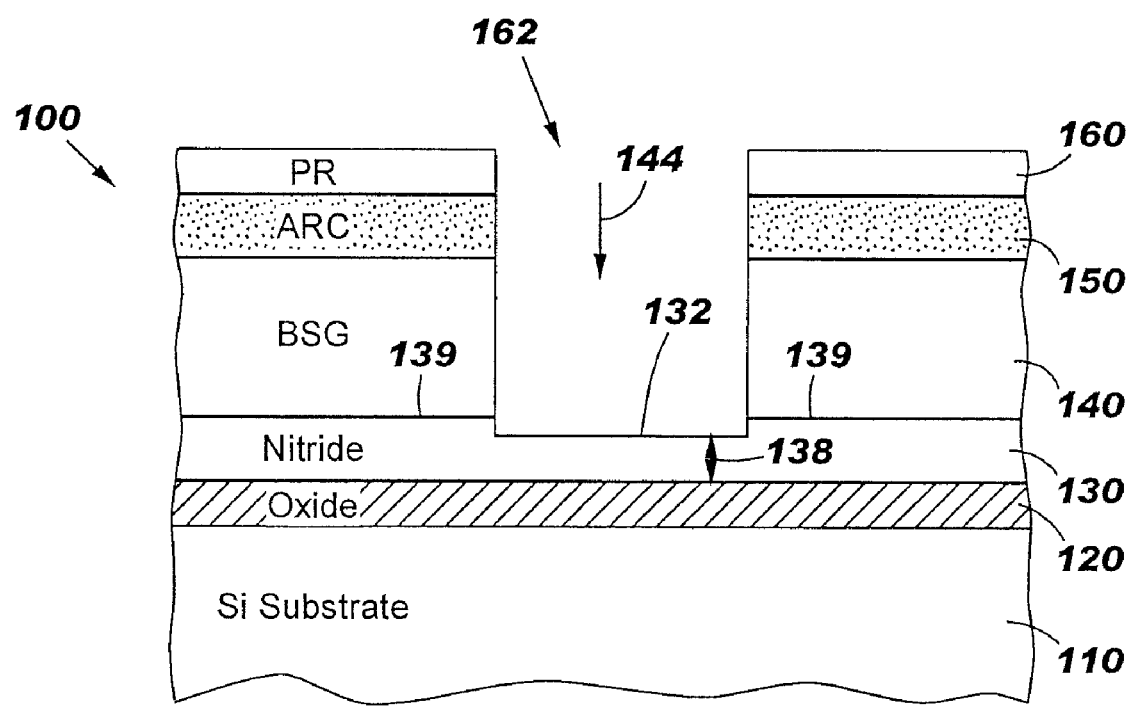
Figure 1E:
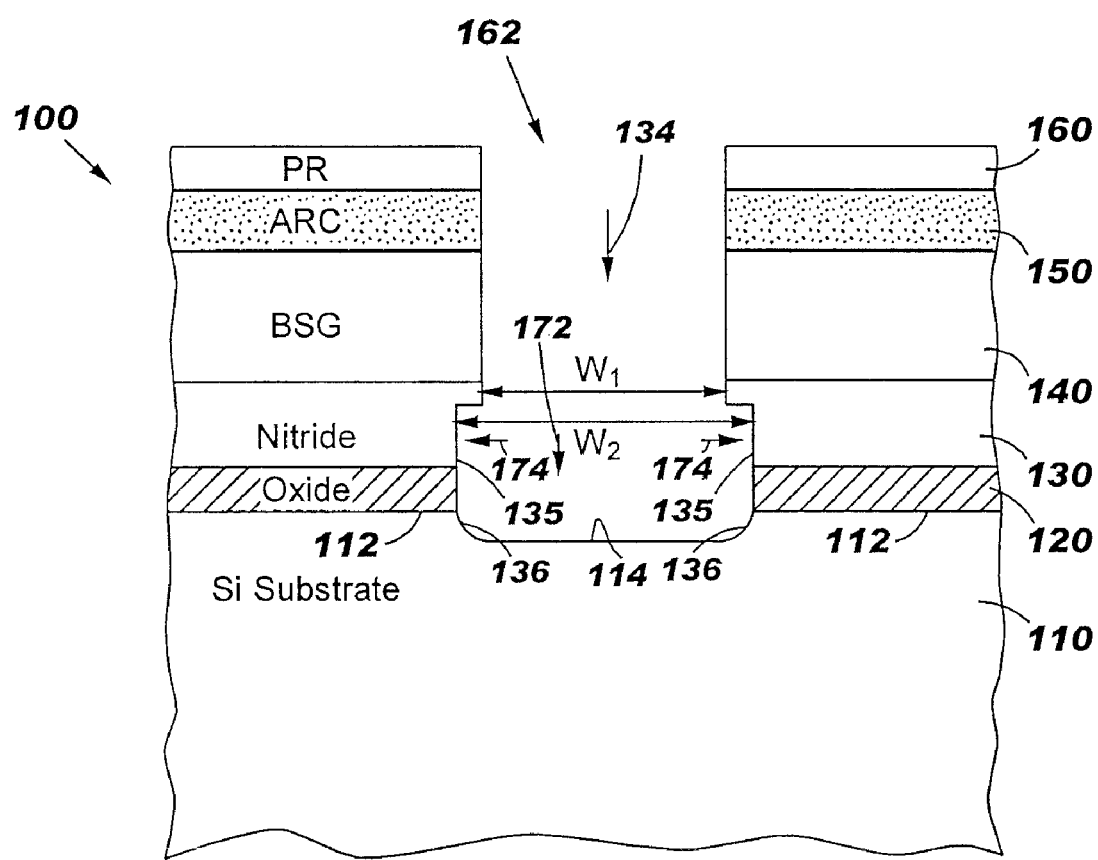

Then, with reference to FIG. 1B, in one embodiment, the photo resist layer 160 can be patterned using, illustratively, photo lithography so as to expose only areas of the hard mask layer 120,130,140,150 directly above the deep trench to be created (i.e., the deep trench 180 in FIG. 1E). As a result of this patterning step, an opening 162 is formed, and a top surface 152 of the ARC layer 150 is exposed to the atmosphere.

Next, with reference to FIG. 1C, in one embodiment, the patterned photo resist layer 160 is used as a mask for an etching step represented by an arrow 154 (hereinafter, referred to as the etching 154) of the ARC layer 150. In one embodiment, for illustration, the etching 154 of the ARC layer 150 can be performed according to the parameters listed in column 2 of table 200 of FIG. 2. More specifically, an RF (radio frequency) power of 500 W can be used to generate glow discharges for the etching 154 of the ARC layer 150. The etching 154 of the ARC layer 150 can be performed in 80 seconds under a pressure of 160 mT. The etching gas mixture can comprise Argon (Ar, a noble gas), Oxygen ($O_2$), and $CH_2F_2$ having flow rates of 500 sccm, 10 sccm, and 20 sccm, respectively. As a result of the etching 154, the opening 162 expands downward, and a top surface 142 of the BSG layer 140 is exposed to the atmosphere as shown in FIG. 1C.

Next, with reference to FIG. 1D, in one embodiment, an etching 144 of the BSG layer 140 is performed through the opening 162. In one embodiment, for illustration, the etching 144 of the BSG layer 140 can be performed according to the parameters listed in column 3 of table 200 of FIG. 2. More specifically, an RF power of 1,400 W can be used to generate glow discharges for the anisotropic etching 144 of the BSG layer 140. The etching 144 of the BSG layer 140 can be performed in 330 seconds under a pressure of 45 mT. The etching gas mixture can comprise CO, Ar, $C_4F_8$, and $O_2$ having flow rates of 50 sccm, 200 sccm, 20 sccm, and 5 sccm, respectively. The duration of the etching 144 is calculated so as to ensure overetching (i.e., etching down past the interface surface 139 between the BSG layer 140 and the nitride layer 130) of the BSG layer 140 to make sure that no BSG material remains at the bottom of the opening 162 after the etching 144. As a result of the etching 144, the opening 162 expands downward through the BSG layer 140 and into the nitride layer 130, and a top surface 132 of the nitride layer 130 is exposed to the atmosphere as shown in FIG. 1D.

Next, with reference to FIG. 1E, in one embodiment, an etching 134 of the nitride layer 130 and the pad oxide layer 120 is performed through the opening 162. In one embodiment, the etching 134 is controlled so as to have a certain degree of anisotropy. The degree of anisotropy is defined as one minus the ratio of lateral etching rate to vertical etching rate, wherein vertical etching refers to etching downward in a direction 172 perpendicular to the top surface 112 of the substrate 110, and lateral etching refers to etching in directions 174 parallel to the top surface 112 of the substrate 110.

In one embodiment, for illustration, the etching 134 of the nitride layer 130 and the pad oxide layer 120 is dry etching (i.e., involves gaseous reactive agents) and can be performed according to the parameters listed in column 4 of table 200 of FIG. 2. More specifically, an RF power of 1,000 W can be used to generate glow discharges for the etching 134. The etching 134 can be performed in 35 seconds under a pressure of 50 mT. The etching gas mixture can comprise CO, $O_2$, and $CH_2F_2$ having flow rates of 40 sccm, 6 sccm, and 20 sccm, respectively. The duration of the etching 134 is calculated so as to ensure overetching (i.e., etching down past the top surface 112 of the substrate 110) of the nitride layer 130 and the pad oxide layer 120 to make sure that no oxide material remains at the bottom of the opening 162 after the etching 134. As a result of the etching 134, the opening 162 expands downward through the nitride layer 130 and the pad oxide layer 120 and into the substrate 110, and a top surface 114 of the substrate 110 is exposed to the atmosphere as shown in FIG. 1E. The opening 162 at this time can be referred to as the hard mask opening 162 through which the etching of the deep trench 180 (FIG. 1E) can be later performed using a conventional etching 184. In one embodiment, the photo resist layer 160 is removed before the etching 184 of the deep trench 180 is performed.

It has been found by the inventors of the present invention that if the etching 134 (FIG. 1E) is controlled such that a side wall 135 of the hard mask opening 162, which is associated with the nitride layer 130 and created by the etching 134, is more vertical, then the ensuing etching 184 (FIG. 1F) of the deep trench 180 causes less damage (e.g., side pocket splinter defects) to the side wall 185 of the deep trench 180. In one embodiment, to obtain a more vertical side wall 135 (FIG. 1E), the etching 134 can be controlled so as to have a lower degree of anisotropy. One way to achieve a lower degree of anisotropy, for illustration, is to decrease in the etching gas mixture the amount of heavy gases (e.g., Argon) which is a source of energetic ions for ion bombardment of the bottom of the hard mask opening 162 during the etching step 134. As a result, the vertical etching rate is reduced, and hence the degree of anisotropy is also lower. Table 200, column 4 (FIG. 2) shows that the flow of Argon is stopped so as to decrease to the minimum the degree of anisotropy of the etching 134 (FIG. 1E). In one embodiment, as a result of the decreased degree of anisotropy for the etching 134, the lateral width W2 (measured in a direction 174) of the bottom portion of the hard mask opening 162 (created by the etching 134) can be greater than the lateral width W1 (measured in a direction 174) of the top portion of the hard mask opening 162 (created by the etching steps 154 and 144). In one embodiment, the side wall 135 of the hard mask opening 162 created by the etching 134 can be substantially vertical (i.e., greater than 89°).

Figure 1F:
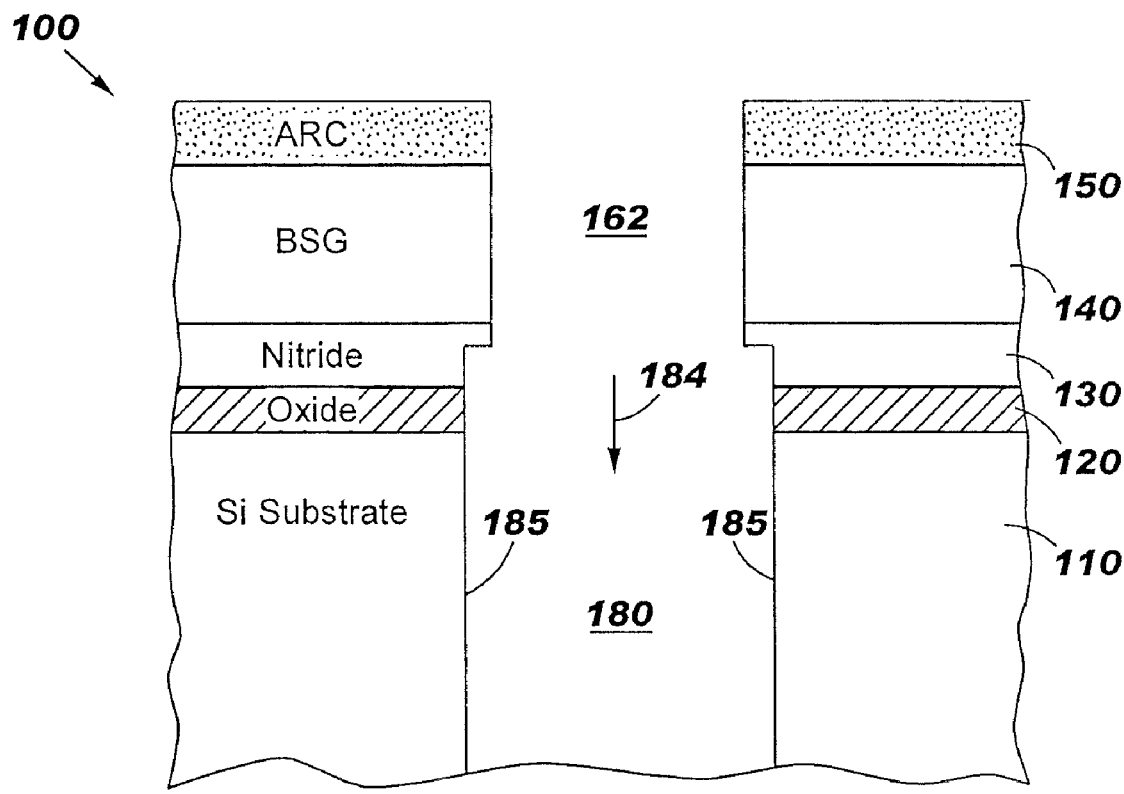

In one embodiment, to obtain a more vertical side wall 135 (FIG. 1E), the etching 144 (FIG. 1D) can be controlled such that a thickness 138 of the nitride layer 130 left after the etching 144 is optimum. The inventors of the present invention observe that when the thickness 138 gets larger, the ensuing etching 134 (FIG. 1E) would take longer, and as a result, more protective materials would deposit on side wall 135 causing the side wall 135 to become less vertical. Conversely, when the thickness 138 gets smaller, the ensuing etching 134 (FIG. 1E) would take shorter, and as a result, less protective materials would deposit on side wall 135 resulting in a more vertical side wall 135. However, when the thickness 138 gets smaller, the side wall 135 also gets shorter, causing the quality of the ensuing etching 184 of the deep trench 180 (FIG. 1F) to get worse. As a result, there exists a certain value (called optimum value) of the thickness 138 below which there is no quality gain for the ensuing etching 184 of the deep trench 180 (FIG. 1F). In one embodiment, this optimum value for the thickness 138 (FIG. 1D) can be obtained through experiments with decreasing (or increasing) values of the thickness 138.

The beneficial effect of a more vertical side wall 135 (FIG. 1E) at the bottom of the hard mask opening 162 can be explained as follows. For a tapered side wall 135, during the etching 184 of the deep trench 180 (FIG. 1F), a portion of the bombarding ion stream (used for bombarding the bottom of the deep trench 180 to help etching reactions to continue downward) would steer downward along the side wall 135 in a non-vertical direction. As a result, this ion stream portion would hit and cause damage to the side wall 185 of the deep trench 180. In contrast, for a more vertical side wall 135, during the etching of the deep trench 180 (FIG. 1F), less of the bombarding ion stream would have non-vertical downward directions. As a result, the impact of the bombarding ion stream on the side wall 185 of the deep trench 180 would be less severe and therefore, there is less damage to the side wall 185 of the deep trench 180.

It has also been found by the inventors of the present invention that if the etching 134 (FIG. 1E) is controlled such that the bottom portion of the hard mask opening 162 created by the etching 134 has a rounder bottom corner 136, then the ensuing etching 184 (FIG. 1F) causes less striations to the side wall 185 of the deep trench 180. In one embodiment, to obtain a rounder bottom corner 136, the etching 134 can be controlled so as to have a lower degree of anisotropy. In other words, by decreasing the degree of anisotropy of the etching 134, the resulting side wall 135 is more vertical and the bottom corner 136 is more round.

In one embodiment, a first plurality of deep trenches (not shown) similar to the deep trench 180 of FIG. 1F are fabricated using the method described in the embodiments above which involves a first thickness 138 (FIG. 1D) and a first set of etching parameters for the etching 134 (FIG. 1E). Then, the quality of the first plurality of deep trenches is measured. In one embodiment, the quality of the first plurality of deep trenches is measured by testing the first plurality of deep trenches individually. In one embodiment, the testing of each of the first plurality of deep trenches can be carried out by testing the device (e.g., capacitor, memory cell, etc.) that comprises the deep trench. Then, in one embodiment, a first yield of the first plurality of deep trenches can be obtained.

In one embodiment, if the first yield is not within an acceptable range of a pre-specified target yield, a second plurality of deep trenches (not shown) similar to the deep trench 180 of FIG. 1F are fabricated using the method described in the embodiments above which involves a second thickness 138 (FIG. 1D) and a second set of etching parameters for the etching 134 (FIG. 1E). In one embodiment, the second thickness 138 is adjusted from the first thickness 138 and/or the second set of etching parameters are adjusted from the first set of etching parameters such that, for each of the second plurality of deep trenches, (a) the side wall 135 of the hard mask opening 162 becomes more vertical, (b) the bottom portion of the hard mask opening 162 created by the etching 134 has a rounder bottom corner 136, and/or (c) the side wall 135 is taller. Then, in one embodiment, a second yield of the second plurality of deep trenches can be obtained.

In one embodiment, if the second yield is not within an acceptable range of a pre-specified target yield, a third plurality of deep trenches (not shown) similar to the deep trench 180 of FIG. 1F are fabricated using the method described in the embodiments above which involves a third thickness 138 (FIG. 1D) and a third set of etching parameters for the etching 134 (FIG. 1E). This process repeats until the yield of the current plurality of identical structures is within an acceptable range of the pre-specified target yield. As a result, the current set of etching parameters for the etching 134 can be used in mass production of deep trenches.

In one embodiment, after the formation of the hard mask opening 162 but before the etching 184 of the deep trench 180 (FIG. 1F), the structure 100 undergoes de-polymerization step according to, illustratively, the parameter values in column 5 of table 200 (FIG. 2). More specifically, an RF power of 500 W can be used to generate glow discharges for the de-polymerization step. The de-polymerization step can be performed in 20 seconds under a pressure of 200 mT. The etching gas mixture can comprise Argon (Ar) and Oxygen having flow rates of 100 sccm and 30 sccm, respectively. The purpose of the de-polymerization step is to remove polymers deposited on the surface of the structure 100. These polymers may partially or completely block the hard mask opening 162. In one embodiment, the de-polymerization step and the formation of the hard mask opening 162 can be carried out in the same tool/chamber (not shown).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
   a hard mask layer on a top substrate surface of a semiconductor substrate, said hard mask layer including a hard mask layer opening through which a portion of the top substrate surface is exposed to a surrounding ambient,
   wherein the hard mask layer comprises a pad oxide layer on the top substrate surface, a nitride layer on the pad oxide layer, a BSG (borosilicate glass) layer on top of the nitride layer, and an ARC (anti-reflective coating) layer on top of the BSG layer,
   wherein a BSG side wall surface of the BSG layer is exposed to the surrounding ambient through the hard mask layer opening,
   wherein an ARC side wall surface of the ARC layer is exposed to the surrounding ambient through the hard mask layer opening,
   wherein the BSG side wall surface and the ARC side wall surface constitute a top side wall surface, and
   wherein there exist two separate points A and B on the nitride side wall surface and two separate points C and D on the top side wall surface such that (i) the four points A, B, C, and D are coplanar, (ii) a plane going through the four points A, B, C, and D is parallel to a reference direction that is perpendicular to the top substrate surface, (iii) both the line segments AB and CD are perpendicular to the reference direction, and (iv) the line segments AB is longer than the line segments CD.

2. A semiconductor structure, comprising:
   a hard mask layer on a top substrate surface of a semiconductor substrate, said hard mask layer including a hard mask layer opening through which a portion of the top substrate surface is exposed to a surrounding ambient,
   wherein the hard mask layer comprises a pad oxide layer on the top substrate surface, a nitride layer on the pad oxide layer, a BSG (borosilicate glass) layer on top of the nitride layer, and an ARC (anti-reflective coating) layer on top of the BSG layer,
   wherein a BSG side wall surface of the BSG layer is exposed to the surrounding ambient through the hard mask layer opening,
   wherein a first lateral width of the hard mask layer opening in a top portion of the hard mask layer opening is less than a second lateral width of the hard mask layer opening in a bottom portion of the hard mask layer opening, and
   wherein the bottom portion is disposed between the top portion and the top substrate surface.

3. The semiconductor structure of claim 2, wherein an ARC side wall surface of the ARC layer is exposed to the surrounding ambient through the hard mask layer opening.

4. The semiconductor structure of claim 2, wherein the BSG side wall surface and the ARC side wall surface constitute a top side wall surface.

5. The semiconductor structure of claim 2, wherein
   wherein a pad oxide side wall surface of the pad oxide layer is exposed to the surrounding ambient through the hard mask layer opening, and
   wherein a nitride side wall surface of the nitride layer is exposed to the surrounding ambient through the hard mask layer opening.

6. The semiconductor structure of claim 2, wherein the nitride layer is sandwiched between the BSG layer and the pad oxide layer, and wherein the BSG layer is sandwiched between the ARC layer and the nitride layer.

7. The semiconductor structure of claim 2, wherein the top portion and the bottom portion are in direct contact with each other in the nitride layer.

* * * * *